United States Patent
Kawai

(10) Patent No.: US 6,366,111 B1
(45) Date of Patent: Apr. 2, 2002

(54) TEST CIRCUIT FOR SEMICONDUCTOR IC DEVICE

(75) Inventor: Ken Kawai, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/483,465

(22) Filed: Jan. 13, 2000

(30) Foreign Application Priority Data

Jan. 26, 1999 (JP) .......................................... 11-016388

(51) Int. Cl.[7] ................................................ G01R 31/28
(52) U.S. Cl. .................................... 324/765; 324/158.1
(58) Field of Search ................................ 324/768, 769, 324/765, 158.1; 365/185.18, 218, 226

(56) References Cited

U.S. PATENT DOCUMENTS 5,077,691 A * 12/1991 Haddad ...................... 365/218
5,877,524 A * 3/1999 Oonakado et al. .......... 257/321
5,945,870 A * 8/1999 Chu et al. .................... 327/536
5,946,258 A * 8/1999 Evertt et al. ................. 365/226
6,016,271 A * 1/2000 Rolandi et al. .......... 365/185.18

FOREIGN PATENT DOCUMENTS

JP          08241589          9/1996

* cited by examiner

Primary Examiner—Safet Metjahic
Assistant Examiner—Vincent Q. Nguyen
(74) Attorney, Agent, or Firm—Morrison & Foerster LLP

(57) ABSTRACT

A test circuit for a semiconductor IC device for measuring a potential at an output node of a boost circuit included in the semiconductor IC device includes a switch having an end connected to the output node; a potential measurement terminal; and an n-channel MOS transistor including a gate connected to another end of the switch, a source connected to a reference voltage supply, and a drain connected to the potential measurement terminal.

8 Claims, 6 Drawing Sheets

TEST CIRCUIT FOR SEMICONDUCTOR IC DEVICE

BACKGROUND OF THE INVENTION

1. Field of the Invention

The present invention relates to a test circuit for a semiconductor IC circuit such as a semiconductor memory device, and specifically to a test circuit for a non-volatile semiconductor memory device such as, for example, a flash memory device.

2. Description of the Related Art

Next generation flash memory devices are required to operate at a lower voltage, to consume less power, and to be produced at lower cost. In order to be able to operate at a lower voltage, a flash memory device generally includes a boost circuit or charge pump circuit for boosting a voltage supplied from an external device. While the flash memory device is in a standby state, the charge pump circuit inactivates the boost operation so that the boosted output voltage is allowed to be decreased to a lowest possible level without causing any problems in operation. While the flash memory device is in an active state, the charge pump circuit outputs the voltage at the boosted level. Flash memory devices are required to be tested before shipping while in a wafer and after packaging to assure that the flash memory devices operate normally when switched from the standby state to the active state.

One of the tests performed at this stage is measurement of a potential of an output node of the charge pump circuit. A conventional test circuit 400 for measuring a potential at an output node VPX of a charge pump circuit 29 will be described with reference to FIG. 4.

The test circuit 400 of a flash memory device includes a low frequency oscillator (hereinafter, referred to as the "LFO") 28 for causing the charge pump circuit 29 to operate in an intermittent manner, word line driving circuits 27 for driving word lines WL1 through WLn, row decoders 26, and an address transition detection (ATD) circuit 30 for detecting an address transition. The charge pump circuit 29, the row decoders 26, and the word line driving circuits 27 each have a conventional structure and will not be described in detail.

The test circuit 400 operates in the following manner.

The charge pump circuit 29 boosts a voltage Vcc supplied by an external power supply to a higher boosted voltage VH (shown in FIG. 5). Also shown in FIG. 5 is VL, which refers to a minimum operable voltage required to guarantee a normal operation of a flash memory device including the charge pump circuit 29. The boosted voltage VH is used as a feed voltage for each row decoder 26 and each word line driving circuit 27. The boosted voltage VH appears at the output node VPX of the charge pump circuit 29. The row decoders 26 respectively output the boosted voltage VH or a voltage Vss (GND) to the word line driving circuits 27, as outputs X1 through Xn, in accordance with signals A1 through An sent from a pre-decoder (not shown).

Each of the word line driving circuits 27 is an inverter buffer including a p-channel MOS transistor and an n-channel MOS transistor. The word line driving circuits 27 invert the signals at the output sections X1 through Xn. Each of memory cells in a memory array (not shown), gates of which are connected to corresponding word lines WL1 through WLn, are switched to a selected state or an unselected state in accordance with the inverted output.

In order to maintain the power consumption at a low level while the flash memory device is in a standby state, the charge pump circuit 29 is controlled to operate in an intermittent manner by a signal LFOP (low frequency oscillator's pulse) from the LFO 28. When the flash memory device is switched into an active state, for example, a read state, the charge pump circuit 29 is controlled by a signal output from the address transition detection circuit 30, which has detected an address transition.

The operation of the test circuit 400 while the flash memory is in a standby state will be described.

FIG. 5 is a diagram illustrating exemplary changes in output voltages from the LFO 28 and the charge pump circuit 29 while the flash memory device is in a standby state. The changes will be described with reference to FIGS. 4 and 5.

The LFO 28 includes a ring oscillator and the output voltage LFOP is switched between a high level Vcc and a low level Vss with a certain period T. The charge pump circuit 29 is activated to perform a boost operation while, for example, the output signal LFOP is at the high level Vcc, to boost the voltage at the output node VPX to a predetermined boosted level VH. While the LFOP is at the low level Vss, the boost operation is not performed by the charge pump circuit 29. Thus, the charge pump circuit 29 itself consumes substantially no power; i.e., the charge pump circuit 29 is in a rest state. In this state, the output node VPX of the charge pump circuit 29 is at a high impedance and therefore is in a floating state. The node VPX is connected to a number of circuits (e.g., row decoders 26 and word line driving circuits 27) and accordingly has a large parasitic capacitance. The potential of the output node VPX is maintained at a certain degree by the accumulation of charges in the parasitic capacitance, but is gradually decreased by, for example, discharge caused by a leak current such as an off-leak current of the p-channel MOS transistor in the word line driving circuits 27. However, when the period T passes, the output signal LFOP of the LFO 28 returns to the high level Vcc. Therefore, the charge pump circuit 29 is activated and starts the boost operation. The voltage at the output node VPX is increased to the boosted level VH while the signal LFOP is at the high level Vcc.

Next, the operation of the test circuit 400 when the flash memory device is switched from a standby state to an active state will be described.

FIG. 6 is a diagram illustrating exemplary changes in the output voltages from the LFO 28 and the charge pump circuit 29 and an exemplary change in a chip enable signal /CE which are seen when the flash memory device is switched from a standby state to an active state. Such changes will be described also with reference to FIG. 4. When the flash memory device is in a standby state, the chip enable signal /CE is at the high level Vcc; and when the flash memory device is switched to an active state, the chip enable signal /CE becomes the low level Vss.

When the flash memory device is switched from a standby state to an active state, i.e., a read state, the charge pump circuit 29 detects that the flash memory device is in the read state by a signal output from the address transition detection circuit 30 which has detected an address transition, not by the output signal LFOP from the LFO 28. The charge pump circuit 29 is maintained in a constantly active state, and the voltage at the output node VPX is kept at the boosted level VH. However, there is a delay-time period TD until the charge pump circuit 29 is activated to output the predetermined boosted voltage VH after the chip enable signal /CE becomes the low level Vss.

Accordingly, immediately after the chip enable signal /CE becomes low, the word lines WL are driven while the voltage at the output node VPX is still low by the discharge. In order to normally access the word lines WL at a satisfactorily high access speed in this state, the potential at the output node VPX needs to be maintained at a sufficiently high above the minimum operable voltage VL even when the flash memory device is in a standby state. However, increasing the oscillation frequency of the LFO 28 in order to maintain the potential at the output node VPX sufficiently higher than the minimum operable voltage VL will result in increasing the power consumption while the flash memory device is in a standby state. In order to avoid this, the oscillation frequency of the LFO 28 and the like are set so that the potential at the output node VPX is kept slightly higher than the minimum operable voltage VL.

When, for example, the off-leak current of the p-channel MOS transistor in the word line driving circuits 27 is excessively large or the oscillation frequency of the LFO 28 is not sufficiently high due to the device-to-device dispersion in the device characteristics, the voltage at the output node VPX can undesirably become lower than the minimum operable voltage VL.

This can cause malfunction or extend the access time. In order to avoid such undesirable effects, the potential at the output node VPX needs to be measured while the flash memory device is in a wafer or after packaging. Flash memory devices having a voltage lower than the voltage VL in a standby state especially need to be eliminated before being put into the market.

While the charge pump circuit 29 is in the constantly active state, i.e., a read state, the potential at the output node VPX can easily be measured through a potential measurement pad 25 by closing a switch 24 (FIG. 4). The switch 24 is controlled by a control signal sent from a test control circuit (not shown) which operates in a test mode. The test control circuit is included in the flash memory device.

The charge pump circuit 29 operates in an intermittent manner while the flash memory device is in a standby state, and the node VPX is in a floating state while the charge pump circuit 29 is in a rest state. Since the charges accumulated in the output node VPX are discharged through a measuring device (not shown) through the potential measurement pad 25 when the switch 24 is closed, accurate measurement of the potential cannot be obtained in a similar manner as used when the charge pump circuit 29 is in the constantly active state.

This results in flash memory devices having a voltage lower than the minimum operable voltage VL in a standby state not being eliminated while the flash memory devices are in wafers. As a result, defective flash memory devices are sent to the packaging stage, which causes extra cost. There is also an undesirable possibility that the defective flash memory devices are not found in the test after packaging and are subsequently put to the market.

Measures taken to avoid the above-mentioned problems cause other problems as follows. Adopting higher-grade specifications results in a lower production yield and raises costs. Setting, for example, the oscillation frequency of the LFO 28 at a higher level at the designing stage results in an increase in the power consumption.

SUMMARY OF THE INVENTION

According to one aspect of the invention, a test circuit for a semiconductor IC device for measuring a potential at an output node of a boost circuit included in the semiconductor IC device includes a switch having an end connected to the output node; a potential measurement terminal; and an n-channel MOS transistor including a gate connected to another end of the switch, a source connected to a reference voltage supply, and a drain connected to the potential measurement terminal.

In one embodiment of the invention, the potential measurement terminal is an internal pad of the semiconductor IC device.

In one embodiment of the invention, the potential measurement terminal is an external pad of the semiconductor IC device.

In one embodiment of the invention, the potential measurement terminal is one of a signal input terminal, a signal output terminal and a signal input and output terminal while the semiconductor IC device is in a normal operation mode. The test circuit further includes another switch provided between the potential measurement terminal and the drain of the n-channel MOS transistor.

According to another aspect of the invention, a test circuit for a semiconductor IC device for measuring a potential at an output node of a boost circuit included in the semiconductor IC device includes a switch having an end connected to the output node; a first potential measurement terminal and a second potential measurement terminal; an n-channel MOS transistor including a gate connected to another end of the switch, a source connected to a reference voltage supply, and a drain connected to the first potential measurement terminal; and another switch having an end connected to the gate of the n-channel MOS transistor and another end connected to the second potential measurement terminal.

In one embodiment of the invention, the first and second potential measurement terminals are internal pads of the semiconductor IC device.

In one embodiment of the invention, the first and second potential measurement terminals are external pads of the semiconductor IC device.

In one embodiment of the invention, the first potential measurement terminal is one of a signal input terminal, a signal output terminal and a signal input and output terminal while the semiconductor IC device is in a normal operation mode. The second potential measurement terminal is one of a signal input terminal, a signal output terminal and a signal input and output terminal while the semiconductor IC device is in a normal operation mode. The test circuit further includes still another switch provided between the first potential measurement terminal and the drain of the n-channel MOS transistor.

Thus, the invention described herein makes possible the advantage of providing a test circuit for a semiconductor IC device realizing accurate potential measurement.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
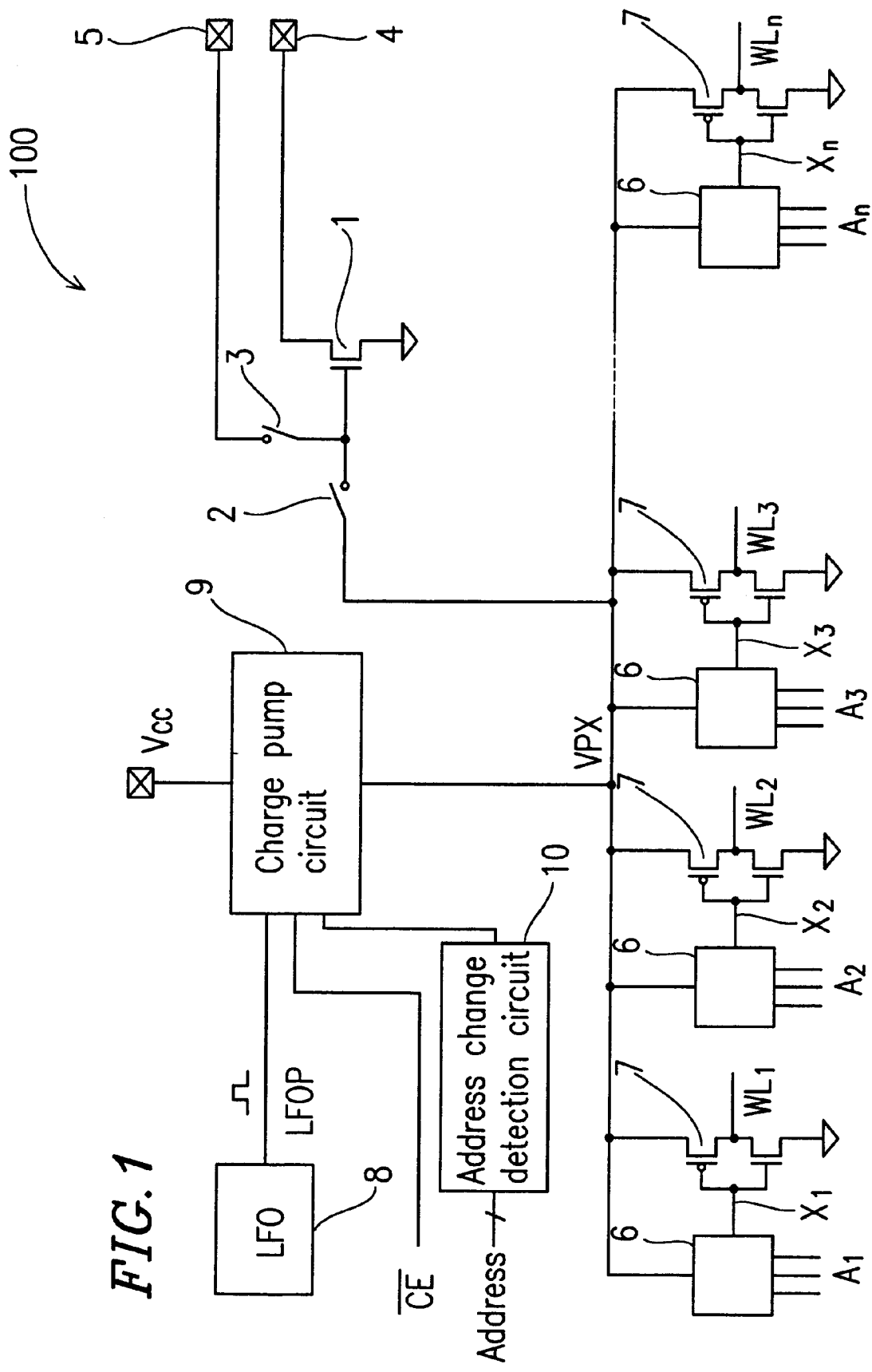
FIG. 1 is a block diagram of a test circuit for a semiconductor IC device in a first example according to the present invention.

FIG. 1 is a circuit diagram of a test circuit 100 for measuring a potential at an output node VPX of a charge pump circuit 9 of a semiconductor IC device in a first example according to the present invention.

Figure 4:
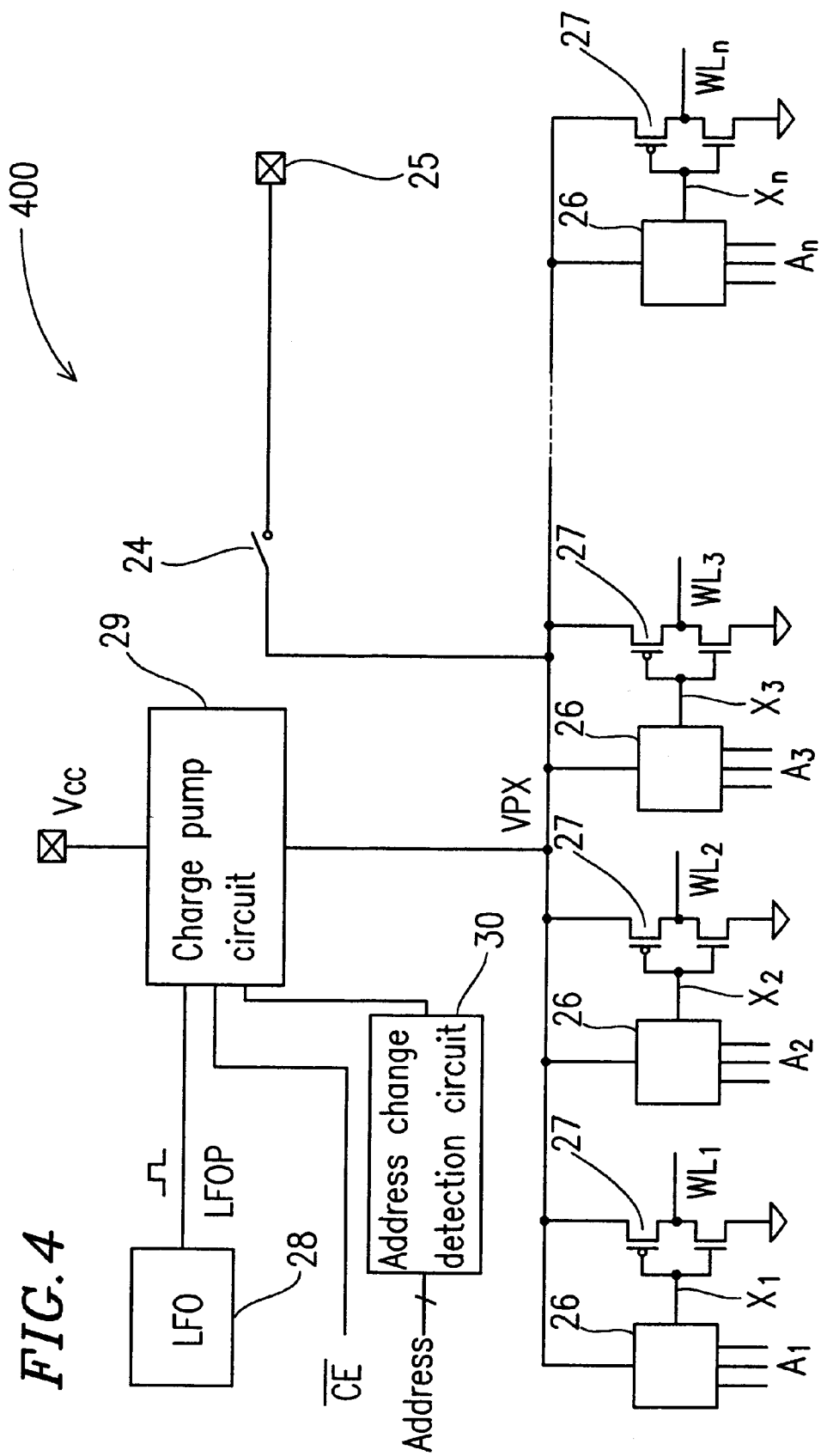
FIG. 4 is a block diagram of a conventional test circuit for a semiconductor IC device.
Figure 5:
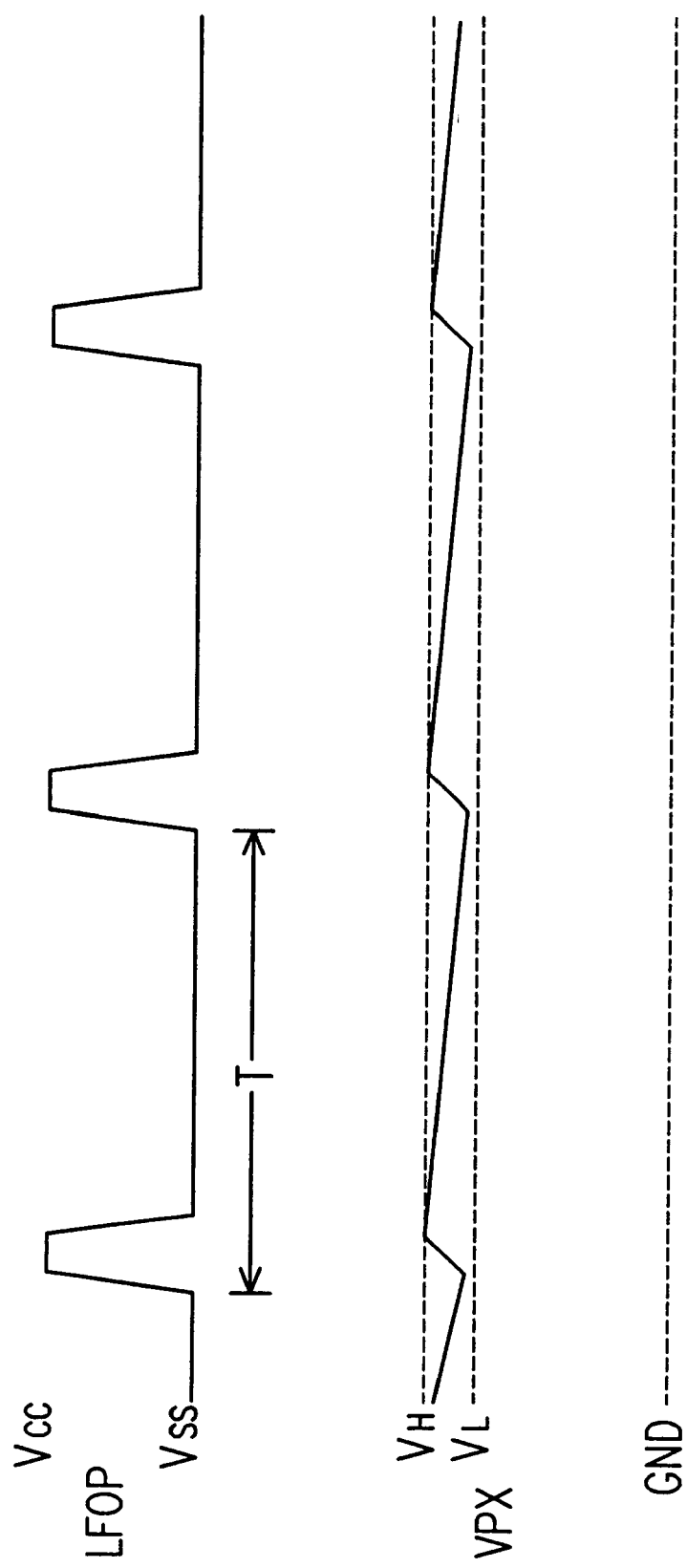
FIG. 5 is a diagram illustrating exemplary changes in output voltages from an LFO and a charge pump circuit of the semiconductor IC device while the semiconductor IC device is in an active state.
Figure 6:
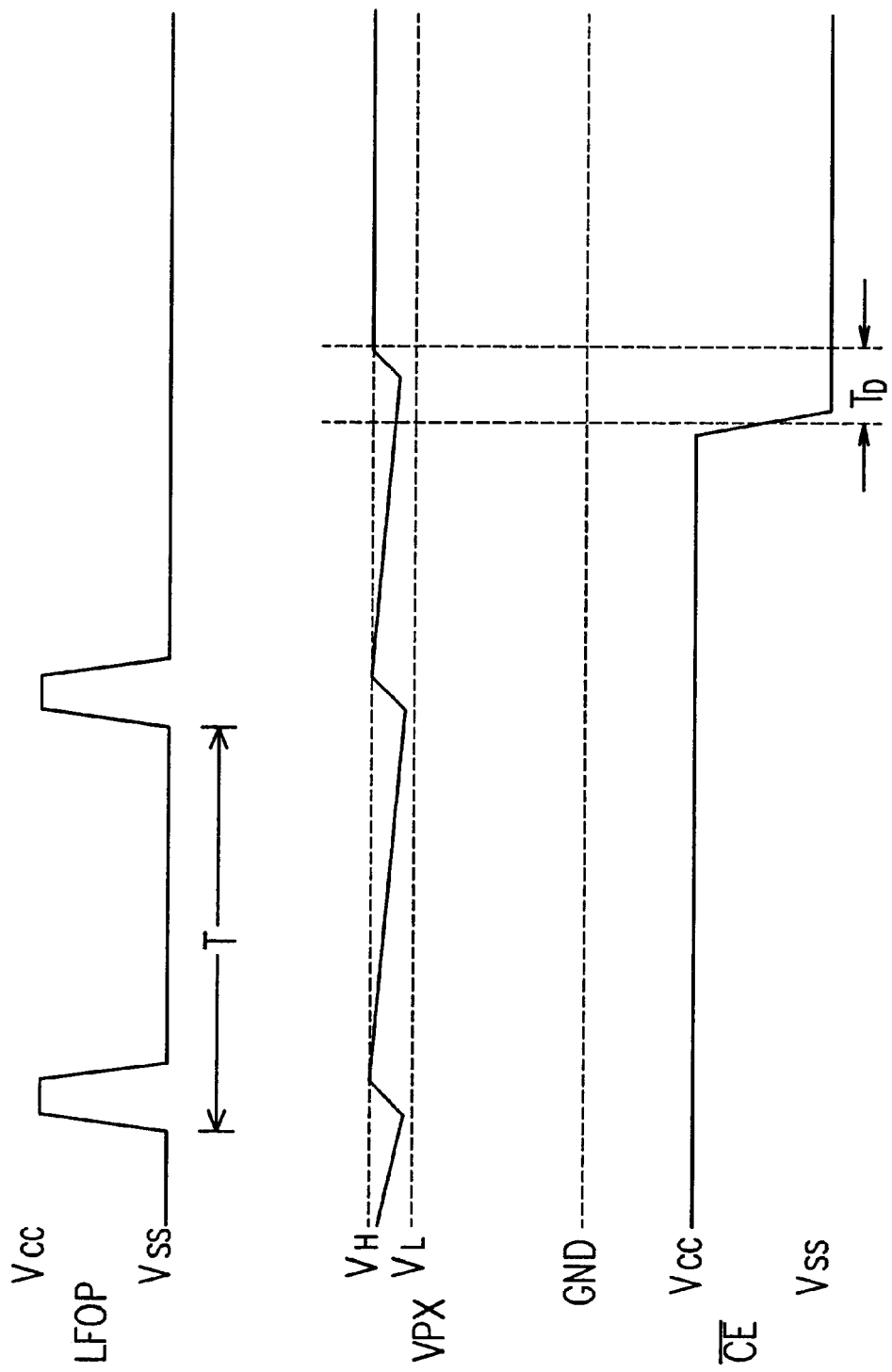
FIG. 6 is a diagram illustrating exemplary changes in the output voltages from the LFO and the charge pump circuit and an exemplary change in a chip enable signal which are seen when the semiconductor IC device is switched from a standby state to an active state.

The test circuit 100 includes an LFO 8 for causing the charge pump circuit 9 to operate in an intermittent manner, an address transition detection circuit 10 for detecting an address transition, word line driving circuits 7 for driving word lines WL1 through WLn, row decoders 6, a first switch 2, a second switch 3, an n-channel MOS transistor 1, a first potential measurement terminal (internal pad) 4, and a second potential measurement terminal (internal pad) 5, and output sections X1 through Xn. Identical elements as those described with reference to FIG. 4 will not be described in detail.

An output node VPX of the charge pump circuit 9 is connected to a gate of the n-channel MOS transistor 1 via the first switch 2. The gate of the n-channel MOS transistor 1 is also connected to one end of the second switch 3. The other end of the second switch 3 is connected to the second potential measurement pad 5. A drain of the n-channel MOS transistor 1 is connected to the first potential measurement pad 4, and a source of the n-channel MOS transistor 1 is connected to a reference power supply GND having a voltage level of Vss.

The switches 2 and 3 can easily be formed by a known technology, for example, of a p-channel or n-channel MOS transistor or CMOS transmission gate. The switches 2 and 3 are controlled by a control signal from a built-in test control circuit (not shown) which operates in a test mode. The built-in test control circuit is included in the semiconductor IC device.

While the semiconductor IC device is in a standby state, the charge pump circuit 9 is controlled by an output signal LFOP from the LFO 8 to operate in an intermittent manner.

An exemplary method for measuring a potential at the output node VPX while the semiconductor IC device is in a standby state will be described.

The first switch 2 is switched to a conductive state and the second switch 3 is switched to a non-conductive state. An appropriate voltage VB is applied to the first potential measurement pad 4. A level of the current I1 flowing through the first potential measurement pad 4 is measured.

Next, the first switch 2 is switched to a nonconductive state and the second switch 3 is switched to a conductive state. The same voltage VB is applied to the first potential measurement pad 4, and a second voltage is applied to the second potential measurement pad 5. The level of the second voltage is adjusted so that the current having the level of I1 flows through the first potential measurement pad 4.

The level VM of the second voltage when the current of the level I1 flows through the first potential measurement pad 4 is equal to the potential at the output node VPX which is to be measured.

According to the structure of the test circuit 100 and the method for measuring the potential at the output node VPX in the first example, the output node VPX is only connected to the gate of the n-channel MOS transistor 1. Therefore, the charges accumulated in the output node VPX are not discharged through a measuring device through the potential measurement pad 4 or 5 during the measurement. Thus, accurate measurement of the potential is realized.

Since the characteristics of the n-channel MOS transistor 1 can be measured through the first potential measurement pad 4, the device-to-device dispersion in the characteristics of the n-channel MOS transistor 1 or measurement errors caused by changes in the characteristics due to the ambient temperature can be compensated for. Thus, the potential at the output node VPX can be measured with a satisfactorily high level of accuracy.

In the above-described method, the potential is measured based on the level of current flowing through the first potential measurement pad 4. In an alternative manner, a power supply and a resistor are appropriately connected to the first potential measurement pad 4 in series, and the potential at the first potential measurement pad 4 is measured.

EXAMPLE 2

Figure 2:
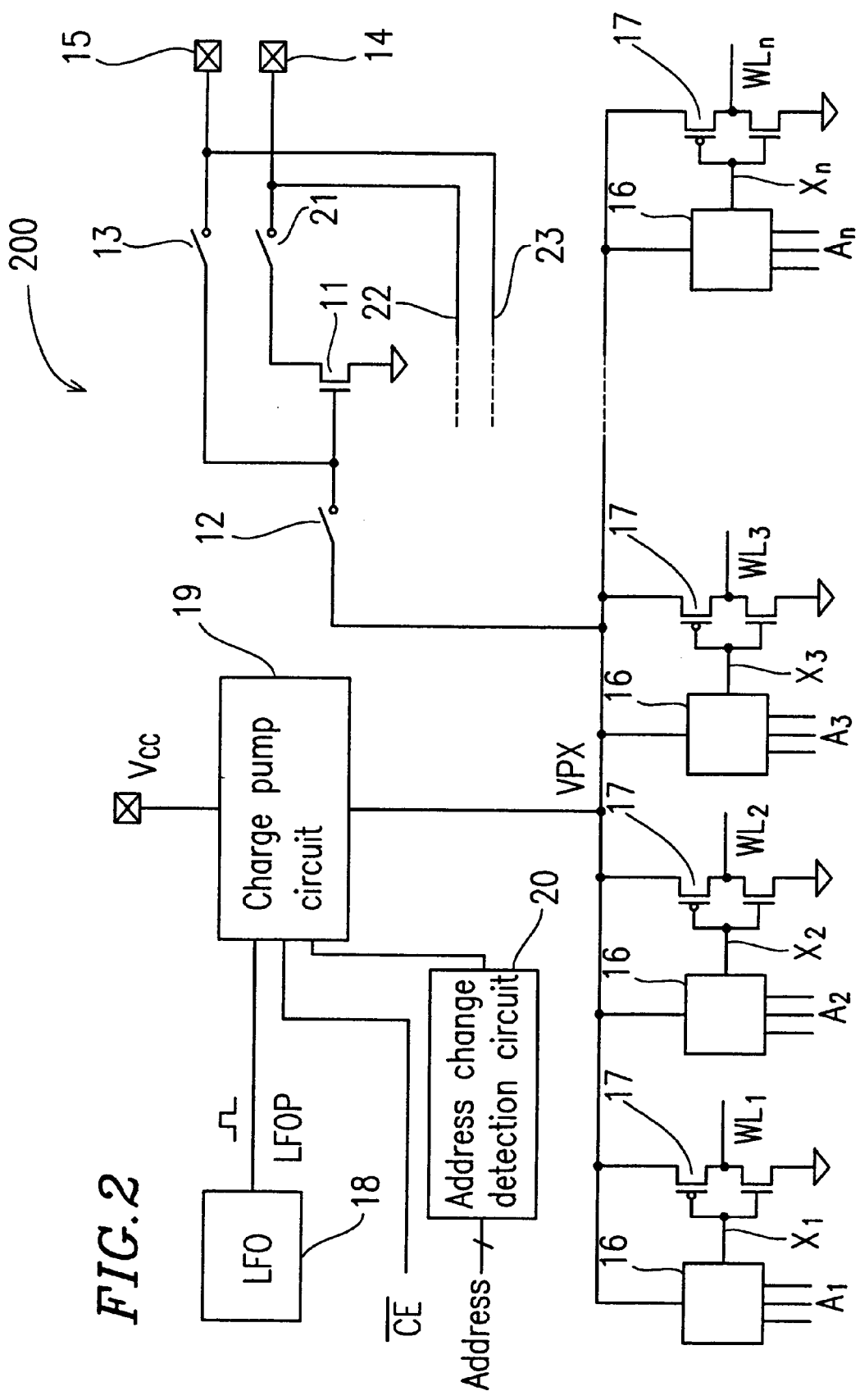
FIG. 2 is a block diagram of a test circuit for a semiconductor IC device in a second example according to the present invention.

FIG. 2 is a circuit diagram of a test circuit 200 for measuring a potential at an output node VPX of a charge pump circuit 19 of a semiconductor IC device in a second example according to the present invention.

The test circuit 200 includes an LFO 18 for causing the charge pump circuit 19 to operate in an intermittent manner, an address transition detection circuit 20 for detecting an address transition, word line driving circuits 17 for driving word lines WL1 through WLn, row decoders 16, a first switch 12, a second switch 13, a third switch 21, an n-channel MOS transistor 11, a first potential measurement terminal (pad) 14, and a second potential measurement terminal (pad) 15. Identical elements as those described with reference to FIG. 1 will not be described in detail.

The second and third switches 13 and 21 are switched depending on whether the semiconductor IC device is in a normal operation mode or a test mode, so that the pads 14 and 15 are usable both for address and data signals and for measurement. Specifically, the pad 14 is used for a signal line 22 (acting as a signal input line, a signal output line, or a signal input and output line; i.e., the pad 14 is an external pad) while in a normal operation and is also connected to a drain of the n-channel MOS transistor 11 through the third switch 21 to be used in measurement. The pad 15 is used for a signal line 23 (acting as a signal input line, a signal output line, or a signal input and output line; i.e., the pad 15 is an external pad) while in a normal operation and is also connected to a gate of the n-channel MOS transistor 11 through the second switch 13 to be used in measurement. The other elements in the structure of the test circuit 200 are identical to those of the test circuit 100 shown in FIG. 1.

The switches 12, 13 and 21 are in a non-conductive state during a normal operation. During a test mode for testing the potential at the output node VPX, the switches 12 and 21 are switched to a conductive state. The potential is measured in the same manner as described in the first example. Circuits (not shown) connected to the signal lines 22 and 23 do not influence the measurement of the potential at the output node VPX since the signal lines 22 and 23 are at a high impedance.

The switches 13 and 21 are preferably located as close as possible to the pads 15 and 14. In this manner, an increase in the input and output capacitances in the pads 14 and 15 caused by the connection to a measurement circuit is minimized.

According to the structure in the second example, the potential at the output node VPX can easily be measured while the semiconductor IC device is in a wafer and also after packaging without the need to add any more measurement pad. The test circuit 200 having such a structure is convenient where the terminal positions of the test circuit 200 need to be compatible with requirements of the semiconductor memory device packaging.

EXAMPLE 3

Figure 3:
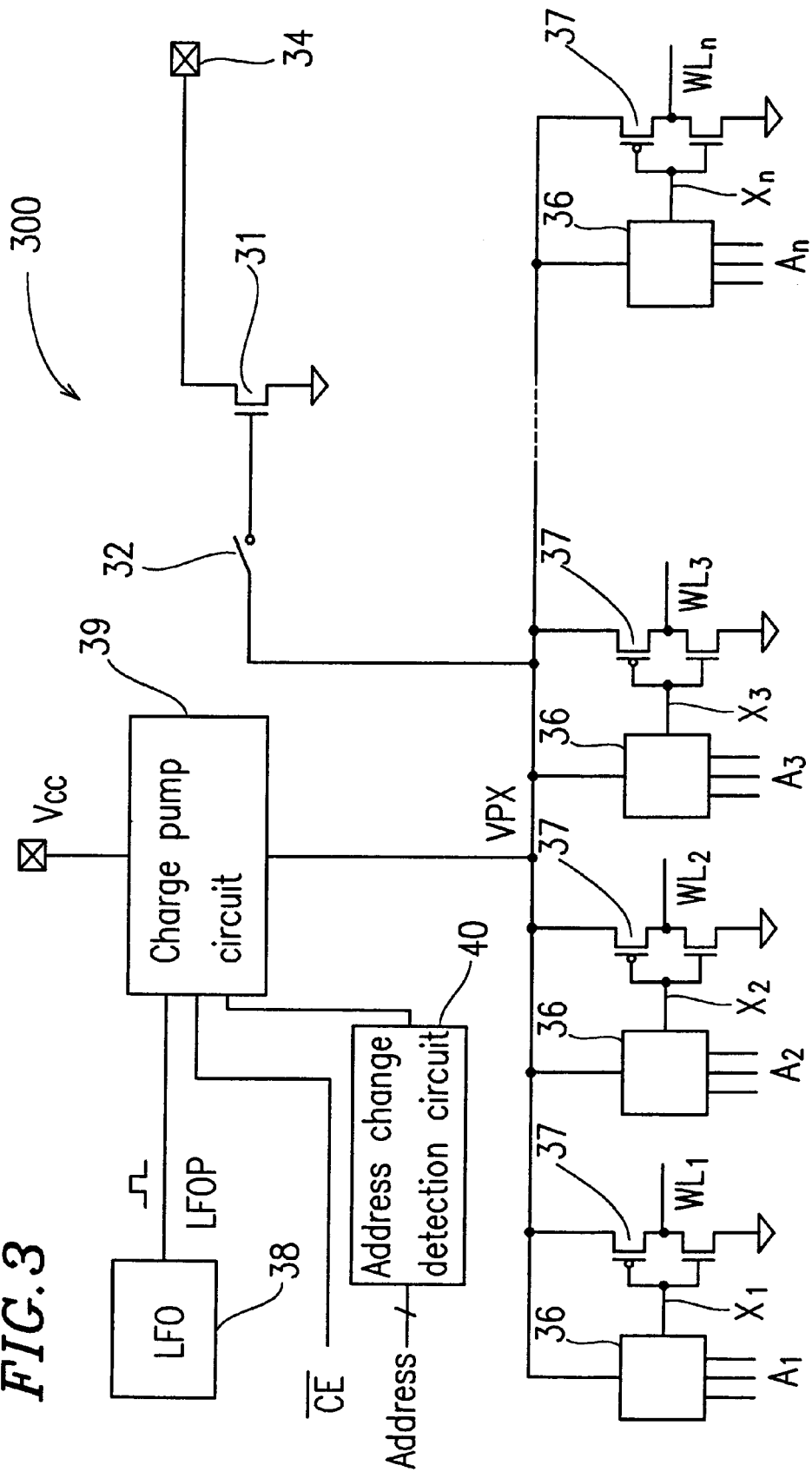
FIG. 3 is a block diagram of a test circuit for a semiconductor IC device in a third example according to the present invention.

FIG. 3 is a circuit diagram of a test circuit 300 for measuring a potential at an output node VPX of a charge pump circuit 39 of a semiconductor IC device in a third example according to the present invention.

The test circuit 300 includes an LFO 38 for causing the charge pump circuit 39 to operate in an intermittent manner, an address transition detection circuit 40 for detecting an address transition, word line driving circuits 37 for driving word lines WL1 through WLn, row decoders 36, a switch 32, an n-channel MOS transistor 31, and a potential measurement terminal (pad) 34. Identical elements as those described with reference to FIG. 1 will not be described in detail.

As compared to the test circuit 100 shown in FIG. 1, the switch 3 connected to the gate of the n-channel MOS transistor 1 and the potential measurement pad 5 are omitted. One end of the switch 32 is connected to the output node VPX, and the other end of the switch 32 is connected to a gate of the n-channel MOS transistor 31. A drain of the n-channel MOS transistor 31 is connected to the potential measurement pad 34. A source of the n-channel MOS transistor 31 is connected to the ground having a voltage level Vss. The other elements of the structure of the test circuit 300 are identical to those of the test circuit 100 shown in FIG. 1.

An exemplary method for measuring the potential at the output node VPX with the test circuit 300 will be described.

Characteristics of a transistor equivalent to the n-channel MOS transistor 31 are measured by a test element group (TEG) taken from the same wafer as the semiconductor IC device which includes the test circuit 300. A table showing the characteristics of the gate-source voltage and the drain current of the n-channel MOS transistor 31 is prepared. The switch 32 is switched to a non-conductive state during a normal operation.

For measuring the potential at the output node VPX while the charge pump circuit 39 operates in an intermittent manner, the switch 32 is switched to a conductive state and an appropriate voltage is applied to the potential measurement pad 34. The level of the current flowing through the potential measurement pad 34 is measured. The potential at the output node VPX is found by checking the level of current with the table.

In the above-described method, the potential is measured based on the level of current flowing through the potential measurement pad 34. In an alternative manner, a power supply and a resistor are appropriately connected to the potential measurement pad 34 in series, and the potential at the potential measurement pad 34 is measured.

According to the structure in the third example, there is a reduction in the number of elements as compared to the structure in the first example by one potential measurement pad and one switch.

The structure in the third example can be applied to the second example. Specifically, another switch is connected to the line which is connected to the potential measurement pad 34 and the switch is turned on or off depending on whether the semiconductor IC device is in a test mode or in a normal operation mode. Thus, the pad used to carry signals (address and data signals) can also be used for potential measurement. In this manner, the number of switches can be reduced as compared to the structure in the second example.

In the first through third examples, the measurement on wafers can be performed by placing a needle of a probe card to a potential measurement pad (internal pad) on the chip.

In a structure in which a potential measurement pad (internal pad) and a terminal of the package (external pad) are electrically connected to each other by wire bonding or the like, the potential can be measured at the external pad after the packaging. In this case, the measurement is performed in conditions closer to the actual working conditions involving the floating capacitances of the package and the like. Thus, more accurate and precise measurement is realized.

In the first through third examples, all the word line driving circuits are connected to one charge pump circuit. In an alternative structure, while one LFO is provided, the word line driving circuits are divided into a plurality of blocks. A charge pump circuit is provided for each block of word line driving circuits. To the output node of each charge pump circuit, a switch or switches, an n-channel MOS transistor, and a potential measurement pad or pads are connected.

The above description is mainly concerns the measurement of a potential of word line driving circuits in a flash memory device. The present invention is applicable to any semiconductor memory device including DRAM or the like, in which the voltage can be boosted in the device and the output node can be put into a floating state for reducing the power consumption while the device is in a standby state.

The present invention is also applicable to the measurement of any potential at a node in a floating state, as well as the potential for driving the word line driving circuits.

According to the present invention, the output node of the charge pump circuit (i.e., boost circuit) is not directly connected to any measurement pad, but only connected to the gate of the n-channel MOS transistor. Therefore, the charges accumulated in the node are not discharged to the measuring circuit, which realizes accurate potential measurement.

According to the present invention, a potential at a node even when in a floating state can be accurately and precisely measured without being influenced by the device-to-device dispersion in the characteristics of the n-channel transistor or measurement errors caused by changes in the characteristics due to the ambient temperature. Undesirable effects are avoided, such as when the production yield is lowered by adopting higher-grade specifications and when the power consumption is increased by setting, for example, the oscillation frequency of the LFO at a higher level at the designing stage. Thus, the production costs and the power consumption are both lowered.

In the embodiment where the external pad of the package and the internal pad in the chip are electrically connected to each other, the potential measurement is possible even after packaging. Since the measurement is performed in conditions closer to the actual working conditions, more accurate and precise measured values can be obtained.

In an embodiment where the switch is turned on or of f depending on whether the semiconductor IC device is in a test mode or in a normal operation mode, the pad which is used for signals during the normal operation mode can be used for measurement during the test mode. This eliminates the necessity of providing additional pads, and furthermore, allows the measurement to be done even after packaging as well as when the device is in a wafer. This is convenient when compatibility of terminal positions is required such as in semiconductor memory devices.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A test circuit for a semiconductor IC device for measuring a potential at an output node of a boost circuit included in the semiconductor IC device, the test circuit comprising:

a switch having an end connected to the output node;

a potential measurement terminal for receiving an applied voltage and measuring a responsive current; and an n-channel MOS transistor including a gate connected to another end of the switch, a source connected to a reference voltage supply, and a drain connected to the potential measurement terminal.

2. A test circuit according to claim 1, wherein the potential measurement terminal is an internal pad of the semiconductor IC device.

3. A test circuit according to claim 1, wherein the potential measurement terminal is an external pad of the semiconductor IC device.

4. A test circuit according to claim 3, wherein the potential measurement terminal is one of a signal input terminal, a signal output terminal and a signal input and output terminal while the semiconductor IC device is in a normal operation mode, and the test circuit further includes another switch provided between the potential measurement terminal and the drain of the n-channel MOS transistor.

5. A test circuit for a semiconductor IC device for measuring a potential at an output node of a boost circuit included in the semiconductor IC device, the test circuit comprising:

a switch having an end connected to the output node;

a first potential measurement terminal for receiving an applied voltage and measuring a responsive current and a second potential measurement terminal for receiving an adjustable second applied voltage;

an n-channel MOS transistor including a gate connected to another end of the switch, a source connected to a reference voltage supply, and a drain connected to the first potential measurement terminal; and another switch having an end connected to the gate of the n-channel MOS transistor and another end connected to the second potential measurement terminal.

6. A test circuit according to claim 5, wherein the first and second potential measurement terminals are internal pads of the semiconductor IC device.

7. A test circuit according to claim 5, wherein the first and second potential measurement terminals are external pads of the semiconductor IC device.

8. A test circuit according to claim 7, wherein the first potential measurement terminal is one of a signal input terminal, a signal output terminal and a signal input and output terminal while the semiconductor IC device is in a normal operation mode; the second potential measurement terminal is one of a signal input terminal, a signal output terminal and a signal input and output terminal while the semiconductor IC device is in a normal operation mode; and the test circuit further includes still another switch provided between the first potential measurement terminal and the drain of the n-channel MOS transistor.

* * * * *